(12) United States Patent (10) Patent No.: US 12,586,638 B2
Chung (45) Date of Patent: Mar. 24, 2026

(54) RESISTIVE MEMORY AND OPERATING METHOD THEREOF

(71) Applicant: Taiwan Semiconductor Memory INC., Hsinchu City (TW)

(72) Inventor: Steve S. Chung, Hsinchu City (TW)

(73) Assignee: TAIWAN SEMICONDUCTOR MEMORY INC., Hsinchu City (TW)

( * ) Notice: Subject to any disclaimer, the term of this patent is extended or adjusted under 35 U.S.C. 154(b) by 203 days.

(21) Appl. No.: 18/317,142

(22) Filed: May 15, 2023

(65) Prior Publication Data

US 2024/0282372 A1     Aug. 22, 2024

(30) Foreign Application Priority Data

Feb. 17, 2023     (TW) ................................. 112105898

(51) Int. Cl.
  *G11C 13/00*     (2006.01)
  *H10B 63/00*     (2023.01)
(52) U.S. Cl.
  CPC ........ *G11C 13/003* (2013.01); *G11C 13/0007* (2013.01); *H10B 63/30* (2023.02); *G11C 2213/79* (2013.01)
(58) Field of Classification Search
  None
  See application file for complete search history.

(56) References Cited

U.S. PATENT DOCUMENTS

| | | | |
|---|---|---|---|
| 8,345,467 B2 | 1/2013 | Kim | |
| 8,451,645 B2 * | 5/2013 | Yoon ................. | G11C 13/0007 365/163 |

| | | |
|---|---|---|
| 9,336,869 B2 | 5/2016 | Chung |
| 9,548,398 B2 | 1/2017 | Chung |
| 9,607,675 B1 | 3/2017 | Huang et al. |
| 10,418,099 B2 | 9/2019 | Inuzuka et al. |
| 10,608,174 B2 | 3/2020 | Li |

(Continued)

FOREIGN PATENT DOCUMENTS

| | | |
|---|---|---|
| TW | I340388 B | 4/2011 |
| TW | I608485 B | 12/2017 |
| TW | I657445 B | 4/2019 |

OTHER PUBLICATIONS

Ming-Chi Wu et al., "Low-Power and Highly Reliable Multilevel Operation in ZrO2 1T1R RRAM," IEEE Electron Device Letters, vol. 32, No. 8, Aug. 2011 (ref. 01, file attached).

(Continued)

*Primary Examiner* — Kretelia Graham
(74) *Attorney, Agent, or Firm* — McClure, Qualey & Rodack, LLP

(57)     ABSTRACT

A memory includes a first select transistor, a first resistor, a second resistor and a first transistor. The first select transistor is configured to provide a first voltage signal to a first node. The first resistor is configured to store a first data bit according to the first voltage signal. A first terminal of the first resistor is coupled to first node. The second resistor is configured to store a second data bit different from the first data bit according to the first voltage signal. A first terminal of the second resistor is coupled to the first node. The first transistor is configured to provide a first bit line signal output corresponding to the first data bit and the second data bit. A control terminal of the first transistor is coupled to the first node.

19 Claims, 2 Drawing Sheets

(56) References Cited

U.S. PATENT DOCUMENTS

| 10,916,303 | B2 | 2/2021 | Roy |
|---|---|---|---|
| 2006/0087877 | A1* | 4/2006 | Cho .................. G11C 13/0069 |
| | | | 365/148 |
| 2009/0135642 | A1 | 5/2009 | Kim et al. |
| 2012/0320659 | A1 | 12/2012 | Kitagawa |
| 2017/0076791 | A1* | 3/2017 | Takahashi ............. G11C 7/065 |
| 2018/0276071 | A1* | 9/2018 | Shimizu ............. G11C 11/1675 |
| 2020/0126617 | A1 | 4/2020 | Kim |

OTHER PUBLICATIONS

Steve S. Chung et al., "A Novel One Transistor Non-volatile Memory Feasible for NOR and NAND Applications in IoT Era," 2016 IEEE Silicon Nanoelectronics Workshop (SNW), 2016 (ref. 02, file attached).
Hsin Wei Pan et al., "1Kbit FINFET Dielectric (FIND) RRAM in Pure 16nm FinFET CMOS Logic Process," 2015 EEE International Electron Devices Meeting (IEDM), 2015 (ref. 03, file attached).
E. R. Hsieh et al., "First Demonstration of Flash RRAM on Pure CMOS Logic 14nm FinFET Platform Featuring Excellent Immunity to Sneak-path and MLC Capability," 2017 Symposium on VLSI Technology Digest of Technical Papers, 2017 (ref. 04, file attached).
Cheng-Jun Lin et al., "3D Stackable Via RRAM Cells by Cu BEOL Process in FinFET CMOS Technologies," 2020 International Symposium on VLSI Technology, Systems and Applications (VLSI-TSA), 2020 (ref. 05, file attached).
Hsin-Yuan Yu et al., "Pure CMOS embedded Artificial Synaptic Device (eASD) for High Density Neuromorphic Computing Chip," 2022 International Symposium on VLSI Technology, Systems and Applications (VLSI-TSA), 2022 (ref. 06, file attached).

* cited by examiner

RESISTIVE MEMORY AND OPERATING METHOD THEREOF

CROSS-REFERENCE TO RELATED APPLICATION

This application claims priority to Taiwan Application Serial Number 112105898, filed Feb. 17, 2023, which is herein incorporated by reference in its entirety.

BACKGROUND

Technical Field

The present disclosure relates to a memory technology. More particularly, the present disclosure relates to a memory and an operating method of a memory.

Description of Related Art

When resistors are stacked on the gate of the transistors, a higher operating voltage is required. An example of such a device is given in U.S. Pat. No. 9,336,869. Accordingly, it is desirable to provide a more reliable architecture to further reduce the operating voltage which can further improve the reliability of the memory cell. Here, transistors in a memory are configured separately for both writing and reading, and the reliability can be greatly improved.

SUMMARY

The present disclosure provides a memory. The memory includes a first select transistor, a first resistor, a second resistor and a first transistor. The first select transistor is configured to provide a first voltage signal to a first node. The first resistor is configured to store a first data bit according to the first voltage signal. A first terminal of the first resistor is coupled to the first node. The second resistor is configured to store a second data bit different from the first data bit according to the first voltage signal. A first terminal of the second resistor is coupled to the first node. The first transistor is configured to provide an output with a first bit line signal corresponding to the first data bit and the second data bit. A control terminal of the first transistor is coupled to the first node.

The present disclosure provides a memory. The memory includes a first transistor, a first select transistor, a first resistor, a second resistor, a first electrode, a first dielectric layer, a second dielectric layer, a second electrode and a third electrode. The first select transistor is configured to provide a voltage signal to a first node, and includes a first doped region. The first resistor is configured to store a first data bit according to the first voltage signal, a first terminal of the first resistor being coupled to the first node. The second resistor is configured to store a second data bit different from the first data bit according to the first voltage signal, a first terminal of the second resistor being coupled to the first node. The first transistor is configured to output a first bit line signal corresponding to the first data bit and the second data bit, and includes a first gate structure, a control terminal of the first transistor being coupled to the first node. The first electrode extends along a first direction, and is configured to couple the first gate structure to the first doped structure. The first dielectric layer extends along the first direction. The second dielectric layer extends along the first direction, and is sandwiched between the first dielectric layer the first electrode. The second electrode has contact with the first dielectric layer. The third electrode has contact with the first dielectric layer, and is separated from the second electrode along the first direction.

The present disclosure provides an operating method of a memory. The operating method includes: providing a first voltage signal having a first voltage level to a first node by a first select transistor; storing a first data bit by a first resistor, wherein a first terminal of the first resistor is coupled to the first node; storing a second data bit different from the first data bit by a second resistor, wherein a first terminal of the second resistor is coupled to the first node; storing a third data bit by a third resistor, wherein a first terminal of the third resistor is coupled to a second node; connecting each of a second terminal of the first resistor and a second terminal of the third resistor to a first word line signal; and providing a bit line signal output corresponding to the first data bit, the second data bit and the third data bit by a first transistor and a second transistor, wherein a control terminal of the first transistor is coupled to the first node, and a control terminal of the second transistor is coupled to the second node.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
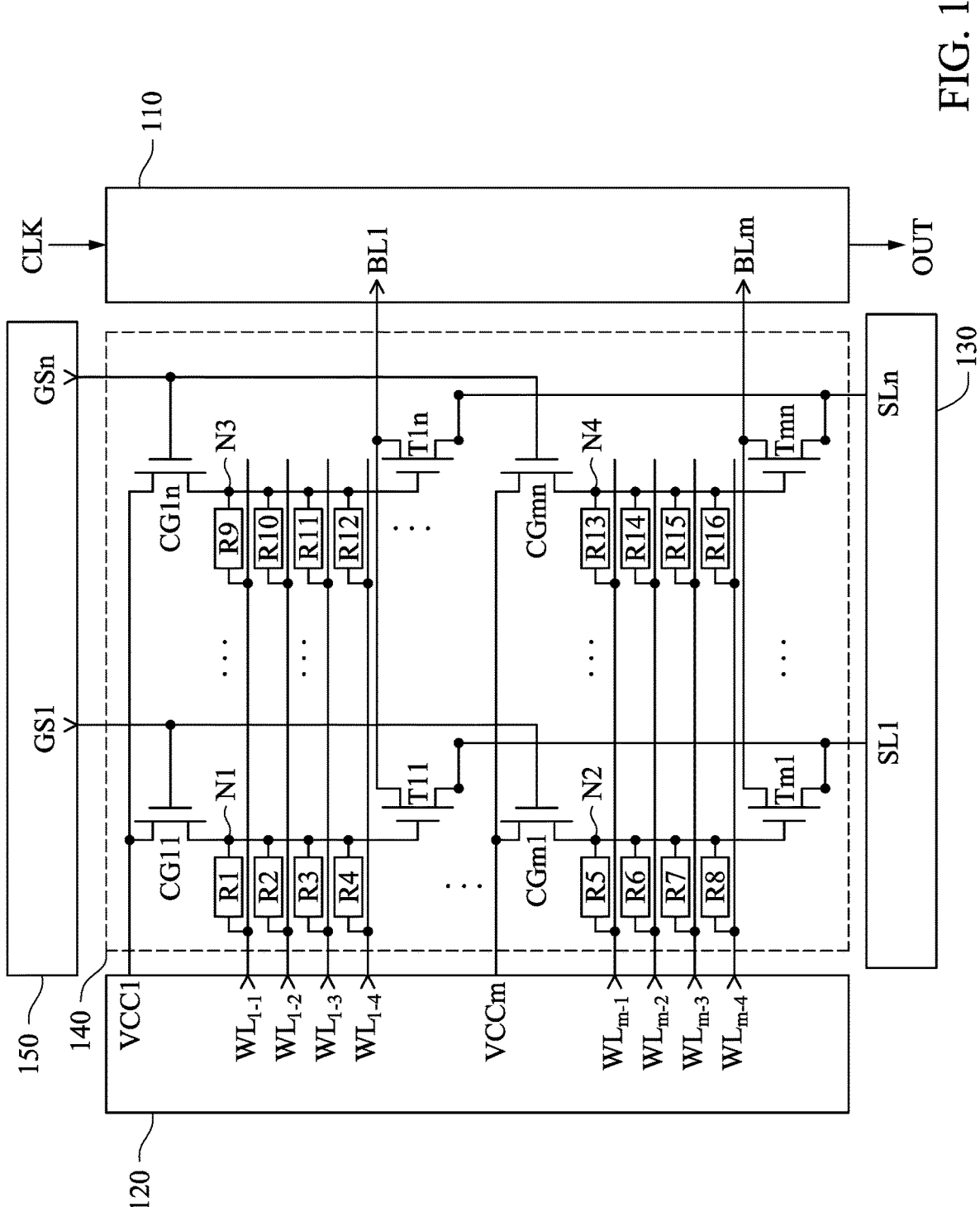
FIG. 1 is a schematic diagram of a memory array according to one embodiment of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Reference will now be made in detail to the present embodiments of the disclosure, examples of which are illustrated in the accompanying drawings. Wherever possible, the same reference numbers are used in the drawings and the description to refer to the same or similar parts.

FIG. 1 is a schematic diagram of a memory 100 illustrated according to one embodiment of this disclosure. In some embodiments, the memory 100 includes an output device 110, a word line/control line device 120, a select line device 130, a gate line device 150 and a memory device 140. As illustrated in FIG. 1, the word line/control line device 120 is configured to provide word line signals $WL_{1-1}$-$WL_{m-4}$ and voltage signals VCC1-VCCm to the memory device 140. The select line device 130 is configured to provide select line signals SL1-SLn to the memory device 140. The gate line device 150 is configured to provide the gate signals GS1-GSn to the memory device 140. In which n and m at the end of the labels are positive integers. The present memory 100 has a capacity of size m×n. The memory device 140 is configured to store data bits, and is configured to generate bit line signals BL1-BLm according to the stored data bits, the voltage signals VCC1-VCCm, the gate signals GS1-GSn, the select line signals SL1-SLn and the word line signals $WL_{1-1}$-$WL_{m-4}$. The output device 110 is configured to generate an output signal OUT according to the bit line signals BL1-BLm and a clock signal CLK. In some embodiments, the output device includes at least one of a bit line multiplexer, a sensing amplifier and a register.

In some embodiments, the memory device 140 includes select transistors CG11-CGmn, transistors T11-Tmn and resistors R1-R16, etc. In some embodiments, the select transistors CG11-CGmn and the transistors T11-Tmn are implemented by field-effect transistors. In some embodiments, the resistors R1-R16 are implemented by resistive memory which can store data bits. For example, when the resistor R1 has a first resistance, the resistor R1 stores a first logic value. When the resistor R1 has a second resistance different from the first resistance, the resistor R1 stores a second logic value different from the first logic value.

As illustrated in FIG. 1, each of control terminals of the select transistors CG11-CGm1 is configured to be connected to the gate signal GS1. Each of control terminals of the select transistors CG1n-CGmn is configured to be connected to the gate signal GSn. A first terminal of the select transistor CG11 is configured to be connected to the voltage signal VCC1. A second terminal of the select transistor CG11 is coupled to a node N1. A first terminal of the select transistor CG1n is configured to be connected to the voltage signal VCC1. A second terminal of the select transistor CG1n is coupled to a node N3. A first terminal of the select transistor CGm1 is configured to be connected to the voltage signal VCCm. A second terminal of the select transistor CG11 is coupled to a node N2. A first terminal of the select transistor CGmn is configured to be connected to the voltage signal VCCm. A second terminal of the select transistor CGmn is coupled to a node N4.

In some embodiments, each of first terminals of the resistors R1-R4 is coupled to the node N1. Second terminals of the resistors R1-R4 is configured to be connected to the word line signals $WL_{1-1}$-$WL_{1-4}$, respectively. Each of first terminals of the resistors R5-R8 is coupled to the node N2. Second terminals of the resistors R5-R8 is configured to be connected to the word line signals $WL_{m-1}$-$WL_{m-4}$, respectively. Each of first terminals of the resistors R9-R12 is coupled to the node N3. Second terminals of the resistors R9-R12 is configured to be connected to the word line signals $WL_{1-1}$-$WL_{1-4}$, respectively. Each of first terminals of the resistors R13-R16 is coupled to the node N4. Second terminals of the resistors R13-R16 is configured to be connected to the word line signals $WL_{m-1}$-$WL_{m-4}$, respectively.

In some embodiments, each of first terminals of the transistors T11-T1n is configured to output the bit line signal BL1. Each of first terminals of the transistors Tm1-Tmn is configured to output the bit line signal BLm. Each of second terminals of the transistors T11-Tm1 is configured to be connected to the select line signal SL1. Each of second terminals of the transistors T1n-Tmn is configured to be connected to the select line signal SLn. Control terminals of the transistors T11, Tm1, Tn1 and Tmn are coupled to the nodes N1-N4, respectively.

In various embodiments, the memory device 140 can include more resistors configured to store data bits. For example, the memory device 140 can include multiple resistors coupled to the node N1 and connected to corresponding word line signals (not shown in figures). Configurations of the resistors described above are similar with the resistors R1-R4. Therefore, some descriptions are not repeated for brevity.

In some embodiments, the memory 100 is configured to perform a first write operation to write a first logic value and a second logic value into a part of first column resistors (that is, the resistors coupled to the select transistors CG11-CGm1, such as the resistors R1-R8), and configured to perform a second write operation after the first write operation to write the first logic value and the second logic value into other parts of the memory device 140.

For example, when the first write operation is performed, the first column resistors R1-R8 are written. At this moment, the gate signal GS1 has an enable voltage level, such that each of the select transistors CG11-CGm1 is turned on. Each of the voltage signals VCC1-VCCm has a first voltage level, such that the nodes N1 and N2 have the first voltage level. Each of the gate signals GS2-GSn has a disable voltage level, such that each of the select transistors CG12-CGm2 and CG1n-CGmn is turned off. Each of the word line signals $WL_{1-1}$-$WL_{m-4}$ has a second voltage level or a third voltage level, in which the second voltage level and the third voltage level corresponds to the first logic value and the second logic value, respectively.

For example, when the first logic value is written into the resistor R1, the word line signal $WL_{1-1}$ has the second voltage level, such that the resistor R1 is changed to the first resistance according to the voltage levels of two terminals of the resistor R1. When the second logic value is written into the resistor R1, the word line signal $WL_{1-1}$ has the third voltage level, such that the resistor R1 is changed to the second resistance according to the voltage levels of two terminals of the resistor R1. In some embodiments, one of the second voltage level and the third voltage level is larger than the first voltage level, and another one of the second voltage level and the third voltage level is smaller than the first voltage level. When the first logic value and the second logic value are written into the resistors R2-R8, the word line signals $WL_{1-2}$-$WL_{m-4}$ have the corresponding second voltage level or the corresponding third voltage level, such that the resistors R2-R8 are changed to the first resistance or the second resistance according to the voltage levels of two terminals of the resistors R2-R8.

For example, when the second write operation is performed, similarly, the operations are performed to a second column of the memory array. The gate signal GS2 has the enable voltage level, such that each of the select transistors CG12-CGm2 is turned on. Each of the voltage signals VCC1-VCCm has the first voltage level, such that corresponding nodes have the first voltage level. Each of the gate signals GS1 and GS3-GSn has the disable voltage level, such that each of the select transistors CG11-CGm1, CG13-CGm3, . . . , CG1n-CGmn is turned off. Each of the word line signals $WL_{1-1}$-$WL_{m-4}$ has the second voltage level or the third voltage level, to write the first logic value or the second logic value into resistors of the second column. As such, the writing of the resistors of the second column is completed.

In some embodiments, when the first write operation is performed, each of the gate signals GS2-GSn has the disable voltage level, such that each of the select transistors CG12-CG1n, CG22-CG2n, . . . , CGm2-CGmn is turned off. As a result, the resistors of other columns (such as the resistors R9-R16) are not affected by the write operation of the first column. When the other columns are written, similar operations are performed. In some embodiments, the first resistance is smaller than the second resistance. The first logic value and the second logic value are a logic value of 1 and a logic value of 0, respectively.

In some embodiments, after the first write operation and the second write operation are performed, the memory 100 further performs the third write operation to the nth write operation in order, to write the third column of resistors of the memory device 140 to the nth column of resistors of the memory device 140 in order.

In other embodiments, the memory 100 can adjust the voltage levels of the $WL_{1-1}$-$WL_{m-4}$ in order, to write the data bits into the resistors R1-R8 in order. Writing methods with various sequences are also contemplated as within the scope of the present disclosure.

In some embodiments, after the first write operation to the nth write operation are performed, the memory 100 further configured to perform a first read operation, to generate the bit line signals BL1-BLm corresponding to the data bits stored in the resistors R1-R8 of the first column. The first read operation includes a first sub read operation to a fourth sub read operation.

For example, when the first read operation is performed, the gate signal GS1 has an enable voltage level (approximately equal to 1 volt), such that each of the select transistors CG11-CGm1 is turned on. At this moment, each of the voltage signal VCC1-VCCm is coupled to the ground, each of the gate signals GS2-GSn has a disable voltage level, such that each of the select transistors CG12-CGm2 and CG1n-CGmn is turned off. The select line signal SL1 has approximately 0.1 volt, such that the transistors T11-Tm1 generate the bit line signals BL1-BLm, respectively. The select line signals SL2-SLn keep being opened, such that the transistors T12-T1n, . . . , Tm2-Tmn do not affect the bit line signals BL1-BLm.

When the first sub read operation is performed, each of the word line signal $WL_{1-1}$ and $WL_{m-1}$ has the enable voltage level, such that the voltage levels of the nodes N1 and N2 correspond to the data bits of resistors R1 and R5, respectively. At this moment, the data bits of resistors R1 and R5 are read through the bit line signals BL1 and BLm, respectively, and are stored temporary in the output device 110 at the first timing of clock signal CLK. When the resistor R1 has the first resistance, the bit line signal BL1 has the first current value. When the resistor R1 has the second resistance, the bit line signal BL1 has the second current value. In some embodiments, the first current value is larger than the second current value.

When the second sub read operation is performed, each of the word line signal $WL_{1-2}$ and $WL_{m-2}$ has the enable voltage level, such that the voltage levels of the nodes N1 and N2 correspond to the data bits of resistors R2 and R6, respectively. At this moment, the data bits of resistors R2 and R6 are read through the bit line signals BL1 and BLm, respectively, and are stored temporary in the output device 110 at the second timing of clock signal CLK.

Similarly, when the third sub read operation is performed, the data bits of resistors R3 and R7 are read through the bit line signals BL1 and BLm, respectively, and are stored temporary in the output device 110 at the third timing of clock signal CLK. When the fourth sub read operation is performed, the data bits of resistors R4 and R8 are read through the bit line signals BL1 and BLm, respectively, and are stored temporary in the output device 110 at the fourth timing of clock signal CLK.

In some embodiments, after the first read operation is performed, the memory 100 is further configured to perform a second read operation of the second column, to read currents of the bit line signals BL1-BLm of the data stored in the resistors of the second column. Each of the second read operation to an nth read operation is similar to the first read operation. Therefore, some descriptions are not repeated for brevity.

When the nth read operation is performed, the gate signal GSn has the enable voltage level (approximately equal to 1 volt), such that each of the select transistors CG1n-CGmn is turned on. At this moment, each of the voltage signals VCC1-VCCm is coupled to the ground, each of the gate signals GS1-GSn−1 has the disable voltage level, such that each of the select transistors CG11-CGm1 and CG1n−1-CGmn−1 is turned off. The select line signal SLn has approximately 0.1 volt, such that the transistors T1n-Tmn generate the bit line signals BL1-BLm, respectively. The select line signals SL1-SLn−1 keep to be opened, such that the transistors T11-T1n−1, . . . , Tm1-Tmn−1 do not affect the bit line signals BL1-BLm.

In some approaches, in a memory device, each unit cell has only one resistor and is only able to store one data bit.

Comparing to the above approaches, in some embodiments of present disclosure, the control terminal of the transistor T11 is coupled to multiple resistors R1-R4. The resistors R1-R4 store different data bits, respectively. The transistor T11 provides the bit line signal BL1 output corresponding to the data bits according to the resistors R1-R4. Each unit cell can expand to more resistors, and is not limited to four resistors R1-R4. As a result, the operating voltage of the whole memory can be reduced significantly, the bit-per-cell can be increased and the relative area of the memory can be reduced significantly.

Figure 2:
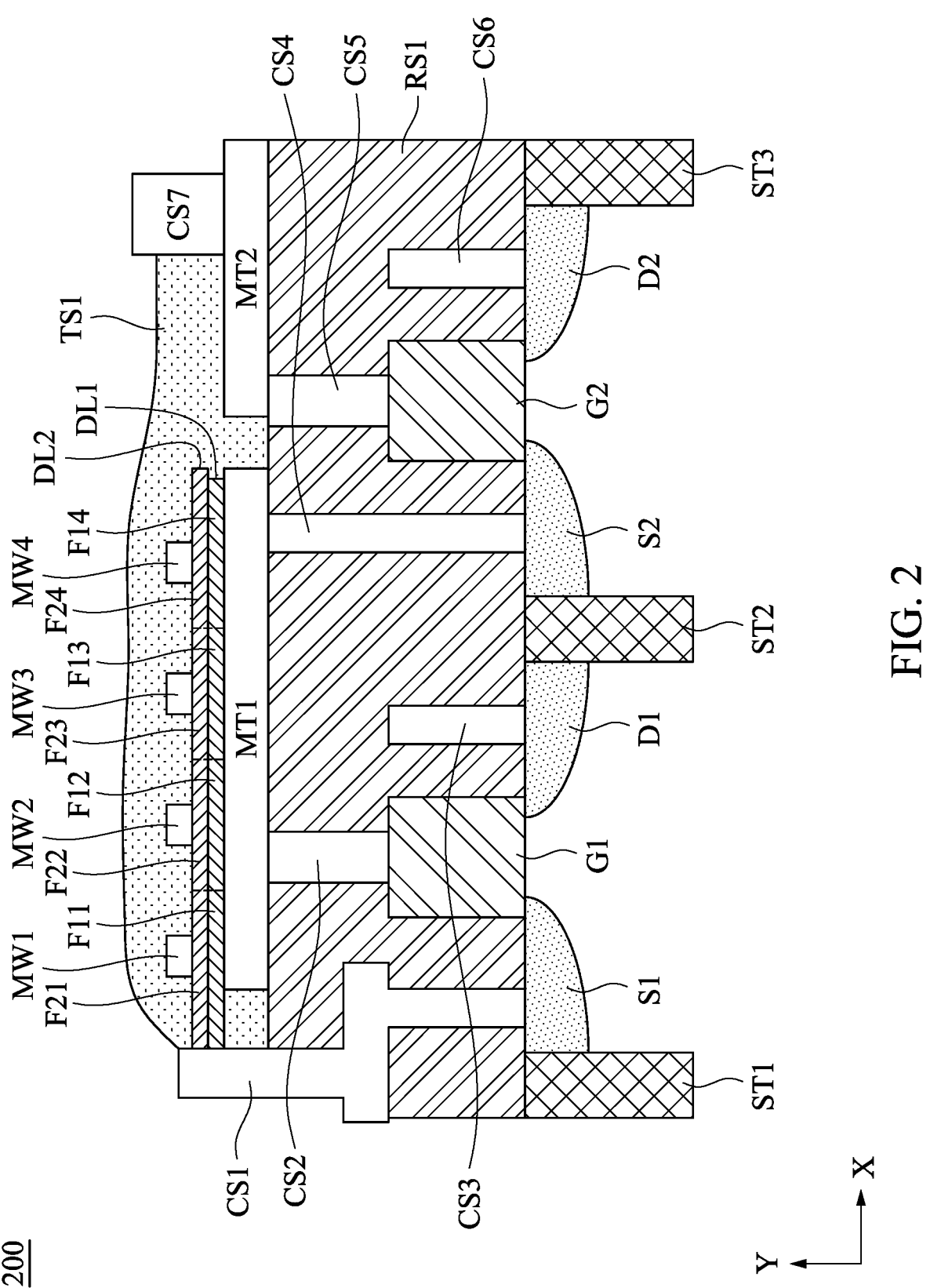
FIG. 2 is a cross section diagram of a memory array according to one embodiment of this disclosure.

FIG. 2 is a cross section diagram of a memory 200 illustrated according to one embodiment of this disclosure. As illustratively shown in FIG. 2, the memory 200 includes gate structures G1, G2, doped regions S1, S2, D1, D2, conductive structures CS1-CS7, electrodes MT1, MT2, MW1-MW4, dielectric layers DL1, DL2, isolation structures ST1-ST3, RS1 and a protection layer TS1.

In some embodiments, the isolation structure ST1, the doped region S1, D1, the isolation structure ST2, the doped region S2, D2 and the isolation structure ST3 are arranged in order along the X direction. Along the Y direction, the conductive structure CS1 contacts the doped region S1, the gate structure G1 contacts the doped regions S1 and D1, the conductive structure CS3 contacts the doped region D1, the conductive structure CS4 contacts the doped region S2, the gate structure G2 contacts the doped regions S2 and D2, and the conductive structure CS6 contacts the region D2. In some embodiments, the X direction and the Y direction are perpendicular with each other.

In some embodiments, the conductive structures CS1-CS6 are arranged in order along the X direction. Along the Y direction, a first terminal of the conductive structure CS2 contacts the electrode MT1, a second terminal of the conductive structure CS2 contacts the gate structure G1, a first terminal of the conductive structure CS4 contacts the electrode MT1, a second terminal of the conductive structure CS4 contacts the doped region S2, a first terminal of the conductive structure CS5 contacts the electrode MT2, a second terminal of the conductive structure CS5 contacts the gate structure G2. The isolation structure is distributed between the conductive structures CS1-CS6.

In some embodiments, along the X direction, the conductive structure CS1 and electrodes MT1, MT2 are arranged in order and are separated from each other. Along the Y direction, a first side of the dielectric layer DL1 contacts the electrode MT1, a second side of the dielectric layer DL1 contacts a first side of the dielectric layer DL2, a second side of the dielectric layer DL2 contacts each of the electrodes MW1-MW4, and the electrode MT2 contacts the conductive structure CS7. Along the X direction, the conductive structure CS1, the electrodes MW1-MW4 and the conductive structure CS7 are arranged in order and are separated from each other. Each of the electrode MT1 and the dielectric layers DL1, DL2 extends along the X direction continuously. The dielectric layer DL1 is sandwiched between the electrode MT1 and the dielectric layer DL2.

As illustrated in FIG. 2, the dielectric layer DL1 includes four portions F11-F14 arranged in order along the X direction. The dielectric layer DL2 includes four portions F21-F24 arranged in order along the X direction. The portions F11-F14 contact the portions F21-F24, respectively. The portions F21-F24 contact the electrodes MW1-MW4, respectively. In some embodiments, the protection layer TS1 contacts and covers the electrodes MW1-MW4, MT2 and the dielectric layer DL2, to protect the electrodes MW1-MW4, MT2 and the dielectric layer DL2.

In some embodiments, the electrodes MW1-MW4, MT1 and MT2 are implemented by metal. The conductive structure CS1-CS6 can include vias. The isolation structures ST1-ST3 are implemented by shallow trench isolation (STI). The protection layer TS1 is implemented by tetraethoxysilane (TEOS). The isolation structure RS1 is implemented by silicon dioxide. The dielectric layers DL1 and DL2 are implemented by different dielectric material. For example, the dielectric layers DL1 and DL2 are implemented by hafnium dioxide ($HfO_2$) and hafnium oxy-nitride (HfON), respectively. In some embodiments, the dielectric layers DL1 and DL2 include more than two dielectric layers.

Referring to FIG. 1 and FIG. 2, at least a part of the memory 100 can by implemented by the memory device 200. In some embodiments, the transistor T11 corresponds to the gate structure G1 and the doped regions S1, D1, and the select transistor CG11 corresponds to the gate structure G2 and the doped regions S2, D2. The resistor R1 corresponds to the portions F11 and F21. The resistor R2 corresponds to the portions F12 and F22. The resistor R3 corresponds to the portions F13 and F23. The resistor R4 corresponds to the portions F14 and F24. The electrode MT1 and the conductive structure CS2, CS4 correspond to the node N1.

In the embodiments described above, the electrodes MW1-MW4 are configured to receive the word line signals $WL_{1-1}$, $WL_{1-2}$, $WL_{1-3}$ and $WL_{1-4}$, respectively. The conductive structure CS1 is configured to transmit the select line signal SL1 to the doped region S1. The conductive structure CS3 is configured to output the bit line signal BL1 from the doped region D1. The conductive structures CS7, CS5 and the electrode MT2 are configured to transmit the gate signal GS1 to the gate structure G2. The conductive structure CS6 is configured to transmit the voltage signal VCC1 to the doped region D2. The doped region S2 receives the voltage signal VCC1 from the doped region D2. The electrode MT1 receives the voltage signal VCC1 through the conductive structure CS4. The portions F11-F14 and F21-F24 are configured to change the resistances according to the voltage signal VCC1 and the word line signals $WL_{1-1}$, $WL_{1-2}$, $WL_{1-3}$ and $WL_{1-4}$.

In various embodiments, various parts of the memory 100 can be implemented by the memory 200. For example, each of the transistors T1n, Tm1 and Tmn can correspond to the gate structure G1 and doped regions S1, D1, and each of the select transistors CG1n, CGm1 and CGmn can correspond to the gate structure G2 and doped regions S2, D2. The correspondences of the transistors T1n, Tm1, Tmn and the select transistors CG1n, CGm1, CGmn are similar to the correspondence between transistor T11 and the select transistor CG11. Therefore, some descriptions are not repeated for brevity.

Although the present disclosure has been described in considerable detail with reference to certain embodiments thereof, other embodiments are possible. Therefore, the concept and scope of the appended claims should not be limited to the description of the embodiments contained herein.

It will be apparent to those skilled in the art that various modifications and variations can be made to the structure of the present disclosure without departing from the scope or concept of the disclosure. In view of the foregoing, it is intended that the present disclosure cover modifications and variations of this disclosure provided they fall within the scope of the following claims.

What is claimed is:

1. A memory, comprising:

a first select transistor configured to provide a first voltage signal to a first node;

a first resistor configured to store a first data bit according to the first voltage signal, a first terminal of the first resistor being coupled to the first node;

a second resistor configured to store a second data bit different from the first data bit according to the first voltage signal, a first terminal of the second resistor being coupled to the first node;

a first transistor configured to provide a first bit line signal output corresponding to the first data bit and the second data bit, a control terminal of the first transistor being coupled to the first node;

a first electrode; and a second electrode separated from the first electrode, wherein the first resistor corresponds to a first portion of a first dielectric layer and a second portion of a second dielectric layer, the second resistor corresponds to a third portion of the first dielectric layer and a fourth portion of the second dielectric layer, the second portion contacts the first portion and the first electrode, and the fourth portion contacts the third portion and the second electrode.

2. The memory of claim 1, further comprising:

a second select transistor configured to provide a second voltage signal to a second node, each of a control terminal of the second select transistor and a control terminal of the first select transistor configured to receive a first gate signal; and a third resistor configured to store a third data bit according to the second voltage signal, a first terminal of the third resistor being coupled to the second node.

3. The memory of claim 2, further comprising:

a fourth resistor configured to store a fourth data bit different from the third data bit according to the second voltage signal, a first terminal of the fourth resistor being coupled to the second node.

4. The memory of claim 3, further comprising:

a second transistor configured to provide a second bit line signal output corresponding to the third data bit when the first transistor provides the first bit line signal output corresponding to the first data bit, a control terminal of the second transistor being coupled to the second node.

5. The memory of claim 1, further comprising:

a second select transistor configured to provide a second voltage signal to a second node, each of a control terminal of the second select transistor and a control terminal of the first select transistor configured to receive a first gate signal.

6. The memory of claim 5, further comprising:

a third resistor configured to store a third data bit according to the second voltage signal, a first terminal of the third resistor being coupled to the second node; and a fourth resistor configured to store a fourth data bit different from the third data bit, a first terminal of the fourth resistor being coupled to the second node.

7. The memory of claim 6, wherein a second terminal of the first resistor is configured to be connected to a first word line signal, and a second terminal of the third resistor is configured to be connected to a second word line signal.

8. The memory of claim 7, wherein a second terminal of the second resistor is configured to be connected to a third word line signal different from the first word line signal, and a second terminal of the fourth resistor is configured to be connected to a fourth word line signal.

9. The memory of claim 6, further comprising:

a second transistor configured to output a second bit line signal, a control terminal of the second transistor being coupled to the second node; and a third select transistor configured to provide the second voltage signal to a third node, a control terminal of the third select transistor configured to receive a second gate signal and the control terminal of the second select transistor configured to receive the first gate signal.

10. The memory of claim 9, further comprising:

a fifth resistor configured to store a fifth data bit according to the second voltage signal, a first terminal of the fifth resistor being coupled to the third node; and a third transistor configured to output the second bit line signal corresponding to the fifth data bit, a control terminal of the third transistor being coupled to the third node.

11. A memory, comprising:

a first select transistor configured to provide a voltage signal to a first node, and comprising a first doped region;

a first resistor configured to store a first data bit according to the voltage signal, a first terminal of the first resistor being coupled to the first node;

a second resistor configured to store a second data bit different from the first data bit according to the voltage signal, a first terminal of the second resistor being coupled to the first node;

a first transistor configured to output a first bit line signal corresponding to the first data bit and the second data bit, and comprising a first gate structure, a control terminal of the first transistor being coupled to the first node;

a first electrode extending along a first direction, and configured to couple the first gate structure and the first doped region;

a first dielectric layer extending along the first direction;

a second dielectric layer extending along the first direction and sandwiched between the first dielectric layer and the first electrode;

a second electrode contacting the first dielectric layer; and a third electrode contacting the first dielectric layer, and separated from the second electrode along the first direction.

12. The memory of claim 11, wherein the first dielectric layer comprises a first portion and a second portion arranged along the first direction in order, the second dielectric layer comprises a third portion and a fourth portion arranged along the first direction in order, the first portion contacts the second electrode and the third portion, and the second portion contacts the third electrode and the fourth portion.

13. The memory of claim 12, wherein the first portion and the third portion correspond to the first resistor, the second portion and the fourth portion correspond to the second resistor, a resistance of the first resistor is changed according to a first word line signal received by the second electrode and the voltage signal received by the first electrode, and a resistance of the second resistor is changed according to a second word line signal received by the third electrode and the voltage signal.

14. The memory of claim 13, further comprising:

a protection layer covers and contacts the first dielectric layer, the second electrode and the third electrode, to protect the first dielectric layer, the second electrode and the third electrode, wherein a dielectric material of the first dielectric layer is different from a dielectric material of the second dielectric layer.

15. The memory of claim 13, further comprising a fourth electrode and a fifth electrode, wherein the second electrode, the third electrode, the fourth electrode and the fifth electrode are arranged in order along the first direction and separated from each other, the first dielectric layer further comprises a fifth portion and a sixth portion, the second dielectric layer further comprises a seventh portion and an eighth portion, the fifth portion contacts the fourth electrode and the seventh portion, and the sixth portion contacts the fifth electrode and the eighth portion.

16. The memory of claim 15, wherein the fifth portion and the seventh portion correspond to a third resistor, the sixth portion and the eighth portion correspond to a fourth resistor, a resistance of the third resistor is changed according to a third word line signal received by the fourth electrode and the voltage signal, and a resistance of the fourth resistor is changed according to a fourth word line signal received by the fifth electrode and the voltage signal.

17. An operating method of a memory, comprising:

providing a first voltage signal having a first voltage level to a first node by a first select transistor;

storing a first data bit by a first resistor, wherein a first terminal of the first resistor is coupled to the first node;

storing a second data bit different from the first data bit by a second resistor, wherein a first terminal of the second resistor is coupled to the first node;

storing a third data bit by a third resistor, wherein a first terminal of the third resistor is coupled to a second node;

connecting each of a second terminal of the first resistor and a second terminal of the third resistor to a first word line signal; and outputting a bit line signal corresponding to the first data bit, the second data bit and the third data bit by a first transistor and a second transistor, wherein a control terminal of the first transistor is coupled to the first node, and a control terminal of the second transistor is coupled to the second node, wherein the first resistor corresponds to a first portion of a first dielectric layer and a second portion of a second dielectric layer, the second resistor corresponds to a third portion of the first dielectric layer and a fourth portion of the second dielectric layer, the second portion contacts the first portion and a first electrode, and the fourth portion contacts the third portion and a second electrode, and the second electrode is separated from the first electrode.

18. The operating method of claim 17, further comprising:

providing a second voltage signal to a third node by a second select transistor, wherein each of a control terminal of the second select transistor and a control terminal of the first select transistor is configured to receive a first gate signal.

19. The operating method of claim 18, further comprising:

storing a fourth data bit according to the second voltage signal by a fourth resistor, a first terminal of the fourth resistor being coupled to the third node; and storing a fifth data bit different from the fourth data bit according to the second voltage signal by a fifth resistor, a first terminal of the fifth resistor being coupled to the third node.

* * * * *